United States Patent [19]

Stahlhofen

[11] Patent Number: 4,560,636
[45] Date of Patent: Dec. 24, 1985

[54] LIGHT-SENSITIVE, POSITIVE-WORKING COPYING MATERIAL HAVING A ROUGH SURFACE PROVIDED BY PIGMENTS IN LIGHT-SENSITIVE LAYER

[75] Inventor: Paul Stahlhofen, Wiesbaden, Fed. Rep. of Germany

[73] Assignee: Hoechst Aktiengesellschaft, Frankfurt am Main, Fed. Rep. of Germany

[21] Appl. No.: 599,816

[22] Filed: Apr. 13, 1984

Related U.S. Application Data

[63] Continuation of Ser. No. 163,581, Jun. 27, 1980, abandoned.

[30] Foreign Application Priority Data

Jun. 26, 1979 [DE] Fed. Rep. of Germany ....... 2926236

[51] Int. Cl.$^4$ .......................... G03C 1/60; G03C 1/94; G03F 7/08
[52] U.S. Cl. ..................................... 430/165; 430/141; 430/191; 430/192; 430/269; 430/270; 430/302; 430/369; 430/950; 430/961
[58] Field of Search ............... 430/191, 192, 165, 166, 430/270, 138, 157, 159, 950, 961, 141, 269, 369, 302

[56] References Cited

U.S. PATENT DOCUMENTS

3,891,443  6/1975  Halpern et al. ..................... 430/259
4,168,979  9/1979  Okishi et al. ........................ 430/950

OTHER PUBLICATIONS

Research Disclosure, Abstract No. 1805g, pp. 160–161, 4/1979.
The Focal Dictionary of Photographic Technologies–D. A. Spencer, 1973–p. 529.
Neblette's Handbook of Photography & Reprography–7th Ed.–Sturge 1977–p. 219.

*Primary Examiner*—Charles L. Bowers, Jr.
*Attorney, Agent, or Firm*—Schwartz, Jeffery, Schwaab, Mack, Blumenthal & Evans

[57] ABSTRACT

This invention relates to a light-sensitive copying material comprising a layer support and a positive-working light-sensitive layer thereon having a rough surface and a content of finely divided particles, wherein the smallest dimension of the particles corresponds at least to the thickness of the layer.

4 Claims, No Drawings

LIGHT-SENSITIVE, POSITIVE-WORKING COPYING MATERIAL HAVING A ROUGH SURFACE PROVIDED BY PIGMENTS IN LIGHT-SENSITIVE LAYER

This is a continuation, of application Ser. No. 163,581, filed June 27, 1980, abandoned.

The present invention relates to a light-sensitive copying material comprising a layer support and a positive-working light-sensitive layer thereon having a rough surface, which material is suitable for the manufacture of printing forms, photoresists and relief images.

German Offenlegungsschrift No. 2,403,487 discloses a letterpress printing plate having a mat surface which is produced by embossing the surface of the light-sensitive layer with an embossing element of a particular surface roughness, for example, a roughened metal surface. This plate has the advantage that it can be rapidly brought into close contact with a smooth original during copying in a vacuum frame, without any formation of air pockets upon evacuation. The matted surface has, furthermore, a better ink receptivity during printing. The light-sensitive layer may contain pigments or fillers to support the matting effect. Because the layer is relatively thick, i.e. about 0.075 to 6.25 mm, the particle size of the pigments or fillers used therein is always substantially smaller than the layer thickness so that these pigments or fillers cause an optical matting, but have practically no influence upon the surface roughness.

For the same purpose, German Offenlegungsschriften Nos. 2,512,043, 2,533,156, 2,606,793, and 2,638,710, describe presensitized printing plates, which either have roughened or discontinuous covering layers which are not light-sensitive, or the light-sensitive layers of which have rough surfaces which have been produced by the application of a rough coating roll. A rough covering layer may, among others, be produced by incorporating a relatively large quantity of a matting agent, for example a pigment, in the ingredients of the layer. In German Offenlegungsschrift No. 2,533,156, page 3, first paragraph, it is, however, pointed out that the incorporation of a relatively large quantity of a matting agent has disadvantages.

It is technologically more difficult to use coating rolls with rough surfaces than rolls with smooth surfaces, because in the case of rough rolls the uniformity of the surface roughness obtained must be constantly controlled. The application of a matted covering layer is an additional working step and is, therefore, also technologically more complicated. It has, furthermore, become apparent that in covering layers which contain relatively large pigment particles and have themselves a certain layer thickness, or in discontinuous covering layers, due to the locally enlarged distance between the original and the light-sensitive layer, there is a tendency to halations and thus to an unprecise reproduction of small image elements, for example screen dots.

Furthermore, the so-called light correction, i.e., the removal of film-edges by exposure to light, becomes much more difficult in printing plates with positive-working copying layers.

In practice, light-correction is normally not practicable, if the aforementioned printing plates are used, because the longer exposure time required for this purpose causes great losses in the fine screen density values, the so-called "highlights". It is, therefore, impossible to obtain a copy which shows the correct screen density value. If, on the other hand, light-correction is not carried out, additional correction work is required for a plate which is to be free from film edges.

It is an object of the present invention to provide a light-sensitive copying material which has the advantages of the hitherto known materials with rough surfaces, but is easier to prepare and has a lower tendency to halations during copying.

The invention is based on a light-sensitive copying material comprising a layer support and a positive-working, light-sensitive layer thereon having a rough surface and a content of finely divided particles.

In the copying material according to the invention, the smallest dimension of the particles corresponds at least to the thickness of the layer. Preferably, the particles are larger than the layer thickness so that the layer surface has a roughness which is, for an essential part, determined by the difference between the particle size and the layer thickness. The average diameter of the particles is, therefore, preferably from 1 to 15 $\mu$m larger than the layer thickness so that the layer surface has an average roughness which is also approximately within this range.

The thickness of the copying layer depends upon the purpose for which the material is intended and corresponds to the conventional values. In the preferred application of the material for the manufacture of planographic printing forms, the layer thickness is usually between 0.1 and 5 $\mu$m, preferably between 1 and 4 $\mu$m.

The average size of the particles which are embedded in the copying layer is, in the case of planographic printing plates, generally between 1 and 20 $\mu$m, preferably between 3 and 10 $\mu$m. The proportion of particles in the copying layer is between 0.02 and 2.0% by weight, preferably between 0.1 and 1.0% by weight, relative to the total content of non-volatile constituents in the copying layer.

As the particles which, according to the invention, are embedded in the light-sensitive copying layer, substances of a type may be used which are compatible with the copying layer, which do not adversely affect the coating of the support, and which can be removed together with the exposed areas of the positive light-sensitive layer by means of a developer without reacting therewith.

Preferred are, for example, particles of silica or silicon dioxide, which may be specially pretreated, particles of aluminum oxide, zinc oxide, aluminum silicate, aluminum hydroxide, titanium dioxide or of organic polymeric compounds which are insoluble in the solvents used for coating. The particles may be of one single substance or particles of different substances may be combined.

For preparing the copying layers, the particles may be added directly to the coating solution while stirring thoroughly. Preferably, they are dispersed in a suitable solvent in a ball mill, together with part of the resin or binder which is used for the copying layer. This dispersion is then added to the rest of the coating solution while stirring thoroughly.

The copying layers contain as the light-sensitive substances 1,2-naphthoquinone diazides, in particular the esters or amides of naphthoquinone-(1,2)-diazide-(2)-sulfonic acid or mixtures of acid-cleavable compounds with photolytic acid progenitors. Derivatives of orthocarboxylic acids, especially orthocarboxylic acid esters and carboxylic acid amide acetals, as well as acetals and N,O-acetals may be used as the acid-cleavable compounds. U.S. Pat. Nos. 3,779,778, and 4,101,323, and German Offenlegungsschrift No. 2,718,254, describe, for example, positive-working mixtures of this kind. The light-sensitive layers furthermore contain alkali-soluble resins, for example, phenolic resins, acrylic acid copolymers or methacrylic acid copolymers, maleic acid copolymers and other polymers containing carboxylic groups. Phenolic resins, in particular novolaks, are preferred.

Further layer components which may be used are smaller amounts, i.e., up to about 20% by weight of the layer, of alkali-insoluble resins, dyes, plasticizers, adhesion-improving agents and other conventional additives.

The choice of suitable supports depends upon the type of printing plate to be prepared. Aluminum, which preferably carries an anodically produced porous oxide layer, is generally used. Appropriately, the aluminum is mechanically, chemically or electrolytically roughened before anodization. Anodization is carried out in known manner, for example in sulfuric acid and/or phosphoric acid, preferably under conditions such that an oxide layer having a layer weight of about 0.5 to 10 g/m$^2$ is obtained.

Advantageously, the oxide layer is pretreated before the light-sensitive layer is applied, in order to improve the printing behavior, in particular the hydrophilic properties of the plate. It is, for example, pretreated with silicates or polyvinyl phosphonic acid. The coating is applied to the support material in known manner, by whirler, spray or dip-coating, by means of rolls, slot dies or doctor blades.

It is advantageous to keep the coating solution in motion by constantly stirring during the coating procedure. Furthermore, wetting or levelling agents may be added to the coating solution to achieve an improved wetting.

For development, the exposed printing plate is treated with a suitable developing solution, preferably a weakly alkaline aqueous solution, so that the layer areas which have been exposed to light are removed and the unexposed areas of the copying layer, including the pigments which are embedded therein, remain on the support.

A large number of prints can be produced from a printing form prepared according to this process.

By means of the pigment-containing copying layer prepared according to the present invention and a suitable layer support, a copying material having a rough or uneven layer surface is obtained, which makes it possible to bring a positive transparency into close contact with the light-sensitive layer and, at the same time, considerably to reduce the time necessary for the evacuation of the vacuum frame. This advantage is achieved without giving rise to halations due to remaining air pockets between the layer surface and the original. The material according to the invention is much easier to prepare than the materials which have been used heretofore for the same purpose. Only one coating which is applied under the usual conditions is necessary, and the layer surface does not require a supplementary treatment, for example embossing.

Compared with copying layers which are provided with an uneven, light-insensitive covering layer which contains a matting agent, or compared with printing plates which additionally have an uneven, regular pattern on their light-sensitive copying layer, the printing plates, prepared according to the invention, have a considerably larger exposure range and do not cause a reduction of screen dots owing to halations.

As mentioned above, the copying material of the present invention is preferably used for the production of planographic printing forms. In principle, it may, however, be used for all applications wherein positive contact copies are made in a vacuum frame and wherein a high degree of image resolution and an exact reproduction of the original is important, i.e. especially in fine line and screen originals. Further applications are, therefore, the manufacture of etched printing forms, for example, multimetal and intaglio printing forms, and photoresists acting as etch or galvano resists, for example, in the production of printed circuits.

The invention will be further illustrated by reference to the following specific examples, wherein parts by weight (p.b.w.) and the parts by volume (p.b.v.) have the same relationship as the g to the ml. If not indicated otherwise, percentages are given in percent by weight.

EXAMPLE 1

Dispersion A:
30.0 p.b.w. of a cresol-formaldehyde novolak having a softening range from 105°–120° C. are dissolved in
100.0 p.b.w. of ethylene glycol monomethyl ether.
To the filtered solution
0.28 p.b.w of a surface-treated silica having a particle size of 4 μm (average value)
is added.
This mixture is kept in intense movement for about 15 minutes by means of a rapid stirrer.

Solution B:
8.50 p.b.w. of the esterification product of 1 mole of 2,3,4-trihydroxy-benzophenone and 3 moles of naphthoquinone-(1,2)-diazide-(2)-5-sulfonic acid chloride,
6.60 p.b.w. of the esterification product of 1 mole of 2,2'-dihydroxy-dinaphthyl-(1,1')-methane and 2 moles of naphthoquinone-(1,2)-diazide-(2)-5-sulfonic acid chloride,
2.10 p.b.w. of naphthoquinone-(1,2)-diazide-(2)-4-sulfonic acid chloride,
35.00 p.b.w. of the above-mentioned cresol-formaldehyde novolak and
0.75 p.b.w. of Crystal Violet (C.I. 42,555)
are dissolved in a solvent mixture composed of
260 p.b.w. of ethylene glycol monomethyl ether,
470 p.b.w. of tetrahydrofuran, and
80 p.b.w. of butyl acetate.

Dispersion A is added to filtered solution B while stirring thoroughly.

An electrolytically roughened and anodized aluminum web is coated with this coating solution by means of a slot die so that a layer weight of about 2.0 g/m$^2$ is obtained. The layer weight expressed in g/m$^2$ in Examples 1 to 5 corresponds approximately to the thickness of the light-sensitive layer in μm.

For the production of a printing form, the printing plate thus obtained is exposed imagewise under a transparent positive original and then developed in known manner using the following solution:
5.3 p.b.w. of sodium metasilicate·9 water
3.4 p.b.w. of trisodium phosphate·12 water, and
0.3 p.b.w. of sodium dihydrogen phosphate (anhydrous) in
91.0 p.b.w. of water.

The exposed areas of the copying layer are removed by development and the unexposed image areas remain on the layer support so that a (positive) printing stencil corresponding to the original is obtained. Approximately 200,000 perfect prints can be produced in an offset press using the printing form so prepared.

The printing plate prepared according to Example 1 can be brought into complete contact with the original after a suction period of only 20 seconds (without application of a pre-vacuum) in the copying frame, and no halation phenomena are observed after exposure, whereas a corresponding comparative plate with an identical copying layer, but without an addition of pigments, can be brought into close contact with the film original only after a suction period of 60 seconds for producing the pre-vacuum, and another suction period of 60 seconds for the post-vacuum.

If printing plates having a size of 1270·1035 mm are mounted in the copying frame together with a transparent original of the same size, which has a 50% screen area (150 dot screen), and the resulting copies are compared after a minimum suction period of, for example, 20 seconds to apply an 85% vacuum, the following results are obtained:

The screen areas of the original are perfectly transferred during the exposure of the printing plate prepared as described in Example 1, whereas the same copying layer to which no pigments have been added, shows halation phenomena in the form of faded places in the screen area due to screen dots which have become smaller or which have been completely lost.

In the following Examples 2 to 5, the procedure used in the above-mentioned Example 1 is repeated and results which are to a large extent identical to those of Example 1 are obtained during copying. In the Examples which follow only the recipes of the coating solutions and the type of support layers used are, therefore, specified in most cases and further brief remarks are only occasionally added.

EXAMPLE 2

Dispersion A:
30.0 p.b.w. of the cresol-formaldehyde novolak specified in Example 1
are dissolved in
100.0 p.b.w. of ethylene glycol monomethyl ether.
After filtration,
0.20 p.b.w. of aluminum oxide having an average particle size of 5 μm
is added to this solution.
This mixture is kept in intense movement for about 20 minutes by means of a rapid stirrer.
Solution B:
10.0 p.b.w. of 4-(α,α-dimethyl-benzyl)-phenylester of naphthoquinone-(1,2)-diazide-(2)-4-sulfonic acid,
5.60 p.b.w. of the esterification product of 1 mole of 2,2'-dihydroxy-dinaphthyl-(1,1')-methane and 2 moles of naphthoquinone-(1,2)-diazide-(2)-5-sulfonic acid chloride,
2.40 p.b.w. of naphthoquinone-(1,2)-diazide-(2)-4-sulfonic acid chloride,
36.00 p.b.w. of cresol-formaldehyde novolak having a softening range from 105° to 120° C. and
0.75 p.b.w. of Crystal Violet base (C.I. 42,555:1)
are dissolved in a solvent mixture composed of:
200 p.b.w. of ethylene glycol monomethyl ether,
500 p.b.w. of tetrahydrofuran, and
75 p.b.w. of butyl acetate.
Dispersion A is added to filtered solution B, while stirring thoroughly.

An electrochemically roughened and anodized aluminum web is coated with this coating solution by means of a slot die, so that a layer weight of 2.8 g/m² is obtained.

EXAMPLE 3

In a ball mill having a volume of 500 ml
0.30 p.b.w. of silicon dioxide of high purity, having an average particle size of about 15 μm and
30.0 p.b.w. of the cresol-formaldehyde novolak specified in Example 1
are dispersed in
150.0 p.b.w. of ethylene glycol monomethyl ether,
with the aid of 150 g of porcelain balls which have a diameter of about 1.5 cm each.

After 4 hours of grinding, this dispersion is added, while stirring thoroughly, to a filtered solution which was prepared as follows:
14.0 p.b.w. of the esterification product of 1 mole of 2,4-dihydroxy-3,5-dibromo-benzophenone and 2 moles of naphthoquinone-(1,2)-diazide-(2)-5-sulfonic acid chloride,
32.0 p.b.w. of the cresol-formaldehyde novolak specified in Example 1,
0.5 p.b.w. of Crystal Violet and
0.3 p.b.w. of Sudan Yellow GGN (C.I. 11,021)
are dissolved in a solvent mixture composed of
200 p.b.w. of ethylene glycol monomethyl ether, and
450 p.b.w. of tetrahydrofuran.

An electrolytically roughened and anodized aluminum web is coated with this coating solution by means of a slot die, so that a layer weight of 3.30 g/m² is obtained.

EXAMPLE 4

Dispersion A:
30.0 p.b.w. of the cresol-formaldehyde novolak specified in Example 1
are dissolved in
150.0 p.b.w. of ethylene glycol monomethyl ether.
After filtration,
0.25 p.b.w. of polyvinyl alcohol (degree of saponification 88%; viscosity of a 4% concentration aqueous solution at 20° C. 8 mPa.s) having an average particle size of about 5 μm
are added.
This dispersion is kept in intense movement for about 20 minutes by means of a rapid stirrer.
Solution B:
12.0 p.b.w. of the esterification product of 1 mole of ethoxyethyl ester of 4,4-bis-(4-hydroxy-phenyl)-n-valeric acid and 2 moles of napthoquinone-(1,2)-diazide-(2)-5-sulfonic acid chloride,
30.0 p.b.w. of the cresol-formaldehyde novolak specified in Example 1,
1.9 p.b.w. of naphthoquinone-(1,2)-diazide-(2)-4-sulfonic acid chloride and
0.7 p.b.w. of Crystal Violet
are dissolved in a solvent mixture composed of
250 p.b.w. of ethylene glycol monomethyl ether,
400 p.b.w. of tetrahydrofuran, and
100 p.b.w. of butyl acetate.

An electrolytically roughened and anodized aluminum web is coated with this coating solution by means of a slot die, so that a layer weight of 2.50 g/m² is obtained.

EXAMPLE 5

Dispersion A:

20.0 p.b.w. of the cresol-formaldehyde novolak specified in Example 1 are dissolved in 400.0 p.b.w. of ethylene glycol monomethyl ether.

After filtration, 0.15 p.b.w. of aluminum hydroxide having an average particle size of 8 μm are added. This dispersion is kept in intense movement for about 15 minutes by means of a rapid stirrer.

Solution B:

12.0 p.b.w. of bis-(5-ethyl-5-butyl-1,3-dioxan-2-yl)-ether of 2-ethyl-2-butyl-propane-1,3-diol, 2.0 p.b.w. of 2-(4-methoxy-naphth-1-yl)-4,6-bis-trichloromethyl-s-triazine, 0.4 p.b.w. of Crystal Violet base, and 20.0 p.b.w. of the cresol-formaldehyde novolak specified in Example 1, are dissolved in a solvent mixture composed of 200 p.b.w. of ethylene glycol monomethyl ether, and 400 p.b.w. of butyl acetate.

Dispersion A is added to solution B, while stirring thoroughly. An electrolytically roughened and anodized aluminum web is coated with this solution, to give a dry weight of 2.3 g/m².

It will be obvious to those skilled in the art that many modifications may be made within the scope of the present invention without departing from the spirit thereof, and the invention includes all such modifications.

What is claimed is:

1. A planographic printing form comprising a layer support and a positive-working light-sensitive layer having a thickness of between about 0.1 and 5 μm and comprising in admixture a light-sensitive constituent selected from the group consisting of a 1,2-naphthoquinone-diazide and a mixture containing (1) a compound which forms a strong acid upon exposure to light and (2) a compound which has at least one acid-cleavable C—O—C bond, which layer has a first surface facing said layer support and a second surface, said second surface being rough and containing from about 0.02 to 2.0 percent by weight, relative to the total content of non-volatile constituents in the layer, of finely divided particles, wherein the average diameter of said particles is from about 1 to 15 μm larger than the thickness of said layer.

2. Copying material as claimed in claim 1 wherein the average diameter of the particles ranges between about 1 and 20 μm.

3. Copying material as claimed in claim 1 wherein the particles comprise silica, aluminum oxide, aluminum silicate, aluminum hydroxide, titanium dioxide, zinc oxide, or an organic polymer which is insoluble in the coating solvent.

4. Copying material as claimed in claim 3 wherein the light-sensitive layer contains a resin which is insoluble in water and soluble in organic solvents and in dilute aqueous-alkaline solutions.

* * * * *